United States Patent
Pham et al.

(10) Patent No.: US 8,846,491 B1
(45) Date of Patent: Sep. 30, 2014

(54) FORMING A DIFFUSION BREAK DURING A RMG PROCESS

(71) Applicant: GLOBALFOUNDRIES Inc., Grand Cayman (KY)

(72) Inventors: Daniel Pham, Clifton Park, NY (US); Zhenyu Hu, Clifton Park, NY (US); Andy Wei, Queensbury, NY (US); Nicholas V. LiCausi, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/921,377

(22) Filed: Jun. 19, 2013

(51) Int. Cl.
*H01L 21/76* (2006.01)
*H01L 29/78* (2006.01)
*H01L 21/762* (2006.01)
*H01L 21/02* (2006.01)

(52) U.S. Cl.
CPC ........ *H01L 29/785* (2013.01); *H01L 21/76224* (2013.01); *H01L 21/02104* (2013.01)
USPC ..... 438/424; 438/221; 438/270; 257/E21.409

(58) Field of Classification Search
CPC ................................... H01L 21/76224
USPC ......................... 438/424, 221, 270
See application file for complete search history.

(56) References Cited

U.S. PATENT DOCUMENTS 8,609,510 B1 * 12/2013 Banna et al. ............. 438/424

* cited by examiner

*Primary Examiner* — Zandra Smith
*Assistant Examiner* — Paul Patton
(74) *Attorney, Agent, or Firm* — Darrell L. Pogue; Keohane & D'Alessandro, PLLC

(57) ABSTRACT

Embodiments herein provide approaches for forming a diffusion break during a replacement metal gate process. Specifically, a semiconductor device is provided with a set of replacement metal gate (RMG) structures over a set of fins patterned from a substrate; a dielectric material over an epitaxial junction area; an opening formed between the set of RMG structures and through the set of fins, wherein the opening extends through the dielectric material, the expitaxial junction area, and into the substrate; and silicon nitride (SiN) deposited within the opening to form the diffusion break.

20 Claims, 9 Drawing Sheets

US 8,846,491 B1

FORMING A DIFFUSION BREAK DURING A RMG PROCESS

TECHNICAL FIELD

This invention relates generally to the field of semiconductors, and more particularly, to forming a diffusion break during a replacement metal gate (RMG) process.

RELATED ART

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well known photolithographic masking, developing and level definition, e.g., etching, implanting, deposition and etc.

As shown in FIG. 1, a prior art device 10 includes a dummy gate 12 covering an isolation trench 14 between a pair of neighboring FinFETs 16A-B to enable a single diffusion break therein. Device 10 further comprises an epitaxial source 18 and drain 20 formed within a substrate 22, and spacers 24 formed along finFETs 16A-B and dummy gate 12. However, patterning isolation trench 14 to reach the small critical dimensions (CD) required is difficult with conventional lithography and etch techniques available. Device 10 suffers from leakage between the S/D through the dummy gate 12.

Furthermore, as shown in FIG. 2, during actual formation, isolation trench 14 is larger than dummy gate 12, and the epitaxy (epi) of source 18 and drain 20 grows non-ideally, which results in asymmetric growth without ideal facets. This is especially problematic when trying to land source and drain contacts on the epi of source 18 and drain 20. In this case, the contact area will not be positioned as high as desired, which may result in current crowding issues. What's more, the structure of device 10 still provides a potential leakage path through dummy gate 12. Therefore, what is needed is an approach that solve one or more deficiencies of the current art.

SUMMARY

In general, embodiments herein provide approaches for forming a diffusion break during a replacement metal gate process. Specifically, a semiconductor device is provided with a set of replacement metal gate (RMG) structures over a set of fins patterned from a substrate; a dielectric material over an epitaxial junction area; an opening formed between the set of RMG structures and through the set of fins, wherein the opening extends through the dielectric material, the epitaxial junction area, and into the substrate; and silicon nitride (SiN) deposited within the opening to form a diffusion break.

One aspect of the present invention includes a method for forming a device, the method comprising: providing a set of replacement metal gate (RMG) structures over a set of fins patterned from a substrate; providing a dielectric material over an epitaxial junction area; forming an opening between the set of RMG structures and through the set of fins, wherein the opening extends through the dielectric material, the expitaxial junction area, and into the substrate; and depositing silicon nitride (SiN) within the opening to form the diffusion break in the device.

Another aspect of the present invention includes a method for forming a diffusion break in a semiconductor device, the method comprising: providing a set of replacement metal gate (RMG) structures over a set of fins patterned from a substrate; providing a dielectric material over an epitaxial junction area; forming an opening between the set of RMG structures and through the set of fins, wherein the opening extends through the dielectric material, the expitaxial junction area, and into the substrate; and depositing silicon nitride (SiN) within the opening to form the diffusion break in the semiconductor device.

Yet another aspect of the present invention includes a semiconductor device, the device comprising: a set of replacement metal gate (RMG) structures over a set of fins patterned from a substrate; a dielectric material over an epitaxial junction area; an opening formed between the set of RMG structures and through the set of fins, wherein the opening extends through the dielectric material, the expitaxial junction area, and into the substrate; and silicon nitride (SiN) deposited within the opening to form a diffusion break.

BRIEF DESCRIPTION OF THE DRAWINGS

These and other features of this invention will be more readily understood from the following detailed description of the various aspects of the invention taken in conjunction with the accompanying drawings in which.

Figure 1:
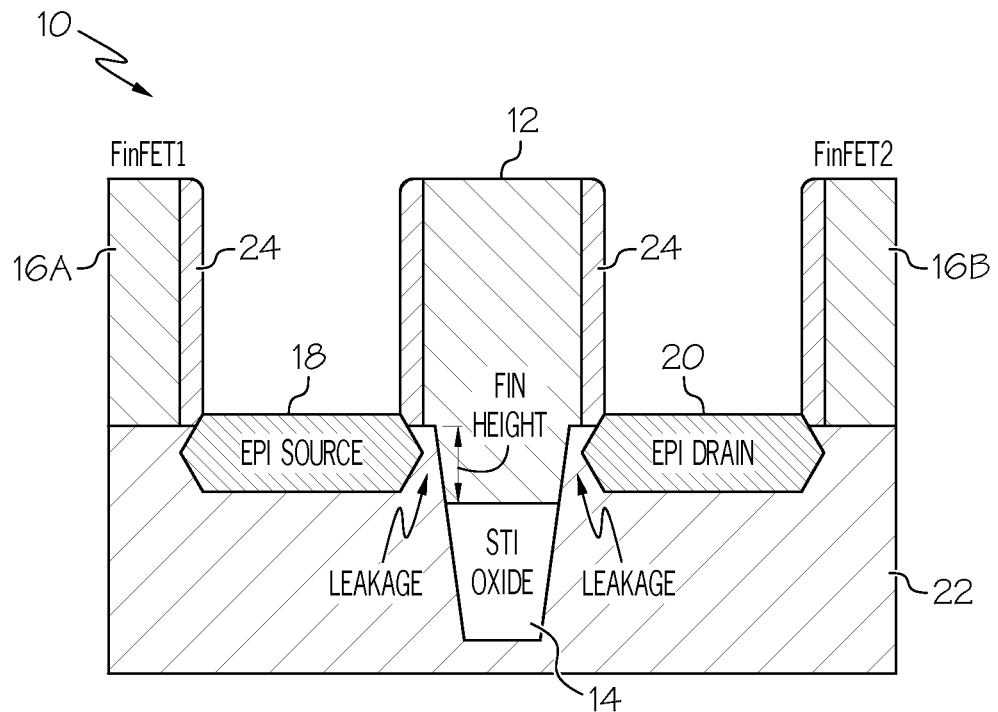
FIG. 1 shows a cross-sectional view of a prior art semiconductor device.
Figure 2:
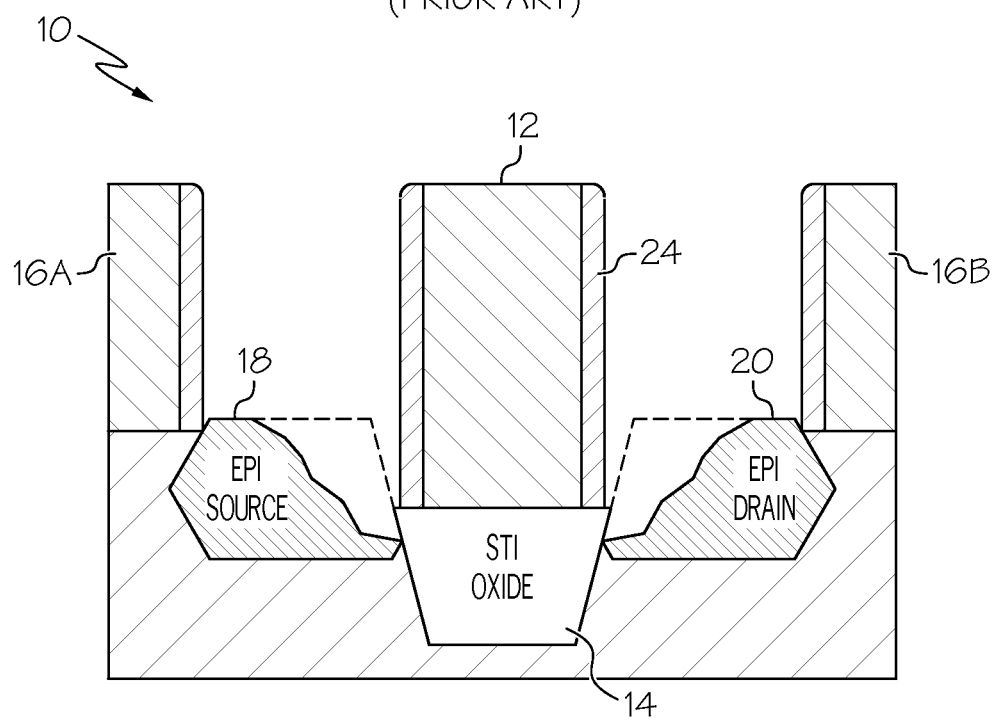
FIG. 2 shows a cross-sectional view of the prior art semiconductor device.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are approaches forming a diffusion break during a replacement metal gate process. Specifically, a semiconductor device is provided with a set of replacement metal gate (RMG) structures over a set of fins patterned from a substrate; a dielectric material over an epitaxial junction area; an opening formed between the set of RMG structures and through the set of fins, wherein the opening extends through the dielectric material, the expitaxial junction area, and into the substrate; and silicon nitride (SiN) deposited within the opening to form the diffusion break.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 3:
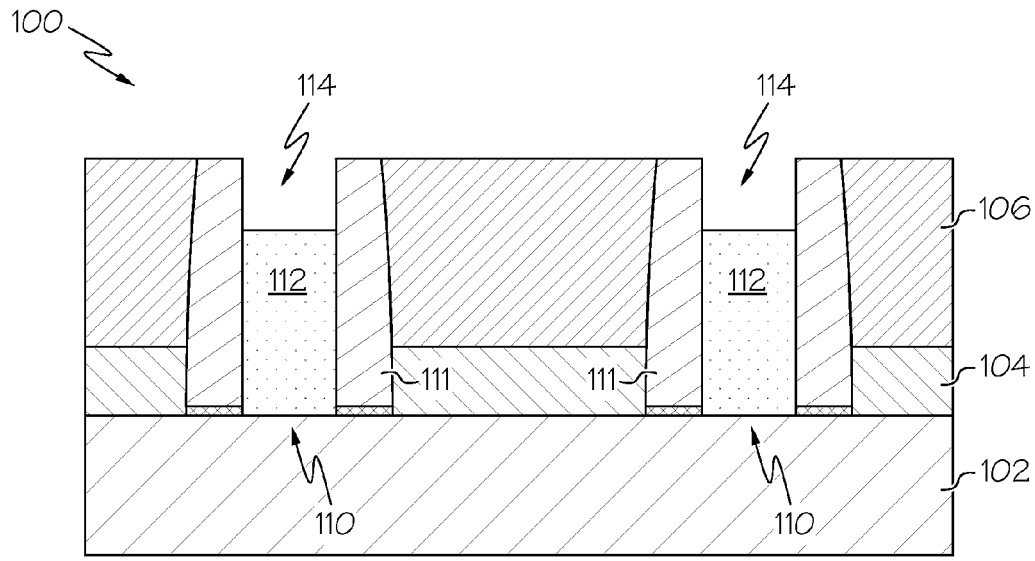
FIG. 3 shows a cross-sectional view of a processing step for forming a diffusion break in a semiconductor device according to illustrative embodiments.

With reference again to the figures, FIG. 3 shows a cross sectional view of a device 100 according to an embodiment of the invention. Device 100 comprises a substrate 102 and an epitaxial (epi) junction area 104 over substrate 102, wherein epi junction area 104 is between each of a set of RMG structures 110 (e.g., finFETs). Also shown is a dielectric material 106 formed over epi junction area 104. RMG structures 110 are formed over a set of fins (not shown in this cross-section) patterned from substrate 102. In one embodiment, substrate 102 includes a silicon substrate (e.g., wafer). Substrate 102 may be silicon in a crystalline structure (e.g., a bulk silicon substrate).

RMG structures 110 may be fabricated using any suitable process including one or more photolithography and etch processes. The photolithography process may include forming a photoresist layer (not shown) overlying substrate 102 (e.g., on a silicon layer), exposing the resist to a pattern, performing post-exposure bake processes, and developing the resist to form a masking element including the resist. The masking element may then be used to etch RMG structures 110 into the silicon layer, e.g., using reactive ion etch (RIE) and/or other suitable processes.

In one embodiment, RMG structures 110 are formed by a double-patterning lithography (DPL) process. DPL is a method of constructing a pattern on a substrate by dividing the pattern into two interleaved patterns. DPL allows enhanced feature (e.g., fin) density. Various DPL methodologies may used including, double exposure (e.g., using two mask sets), forming spacers 111 adjacent features and removing the features to provide a pattern of spacers, resist freezing, and/or other suitable processes.

As shown in FIG. 3, a metal material 112 (e.g., tungsten (W)) is formed within each RMG structure 110, following the removal of polysilicon. Metal material 112 is recessed to form an opening 114 within each RMG structure 110. To accomplish this, opening 114 is patterned, for example, using a photo-lithography processes or other lithographic process (e.g., electron beam lithography, imprint lithography, etc.), and removed by a suitable etching process including a wet etch, dry etch, plasma etch, and the like. In one embodiment, a hard mask comprising SiN or SiO2 is used.

Figure 4:
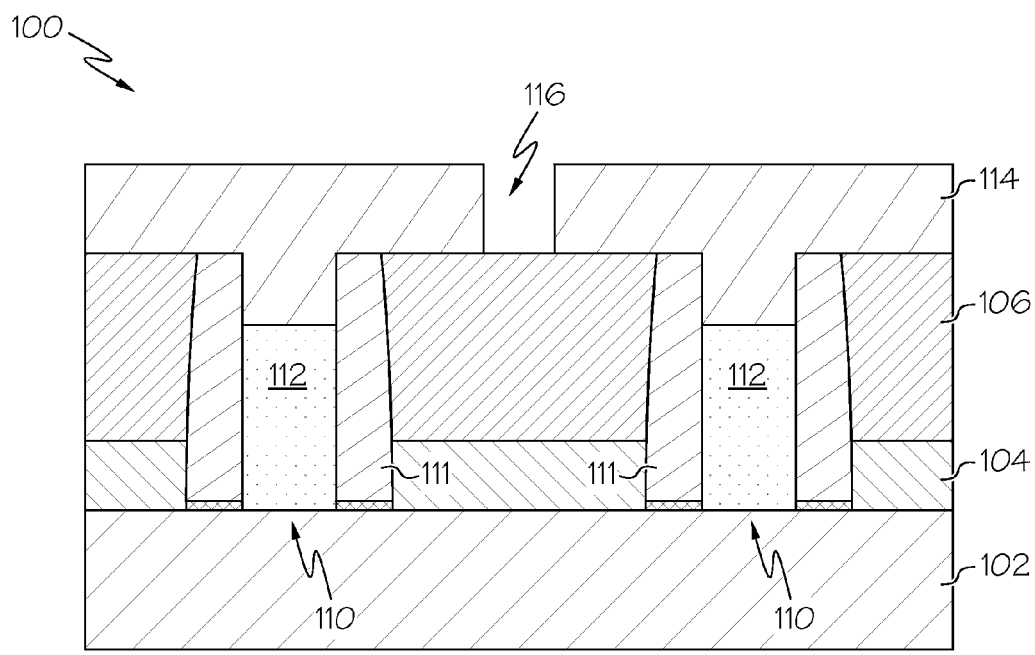
FIG. 4 shows a cross-sectional view of a processing step for forming the diffusion break in the semiconductor device according to illustrative embodiments.

Next, as shown in FIG. 4, a mask 114 is formed over device 100, and an opening 116 is formed therein. In one embodiment, opening 116 is patterned, for example, using a photo-lithography processes or other lithographic process (e.g., electron beam lithography, imprint lithography, etc.), and removed by a suitable etching process including a wet etch, dry etch, plasma etch, and the like. In one embodiment, hard mask 114 comprises SiN or SiO2.

Figure 5:
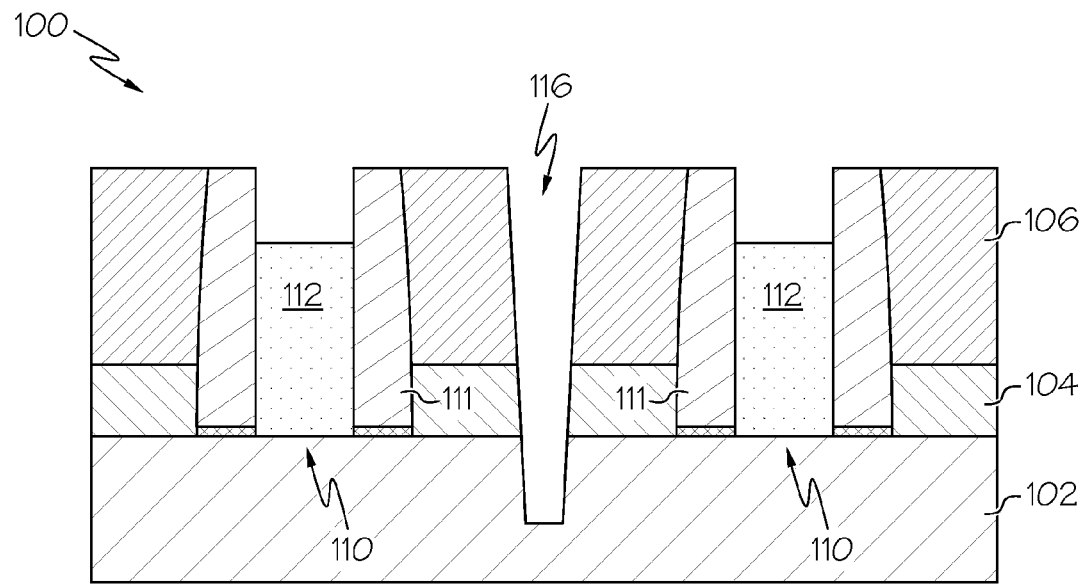
FIG. 5 shows a cross-sectional view of a processing step for forming the diffusion break in the semiconductor device according to illustrative embodiments.
Figure 6:
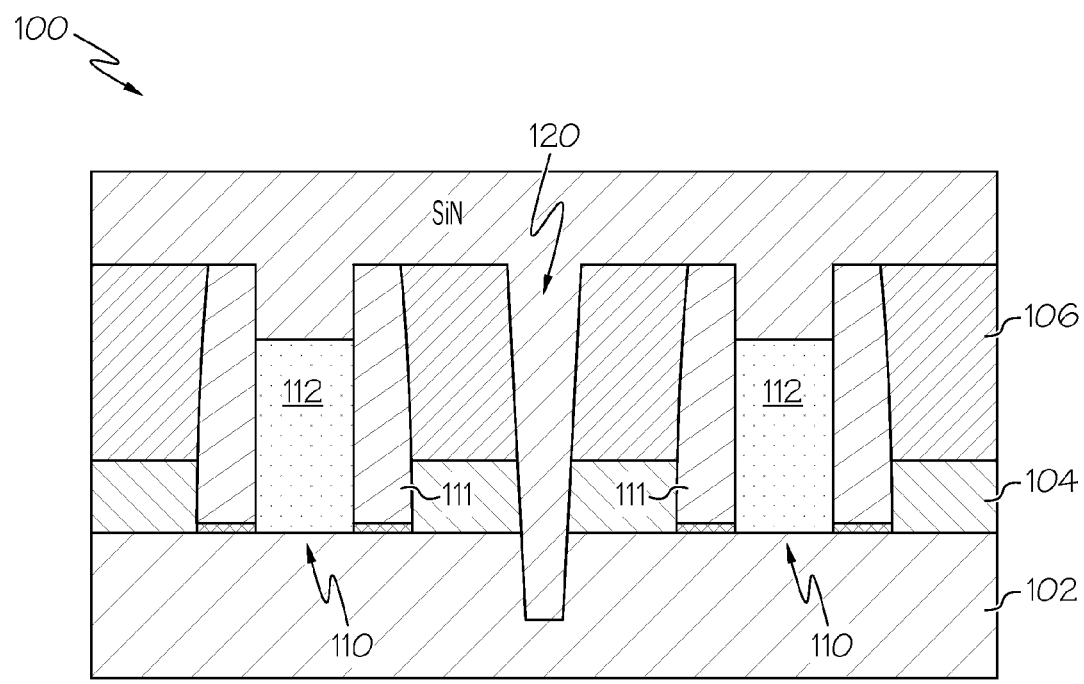
FIG. 6 shows a cross-sectional view of a processing step for forming the diffusion break in the semiconductor device according to illustrative embodiments.
Figure 7:
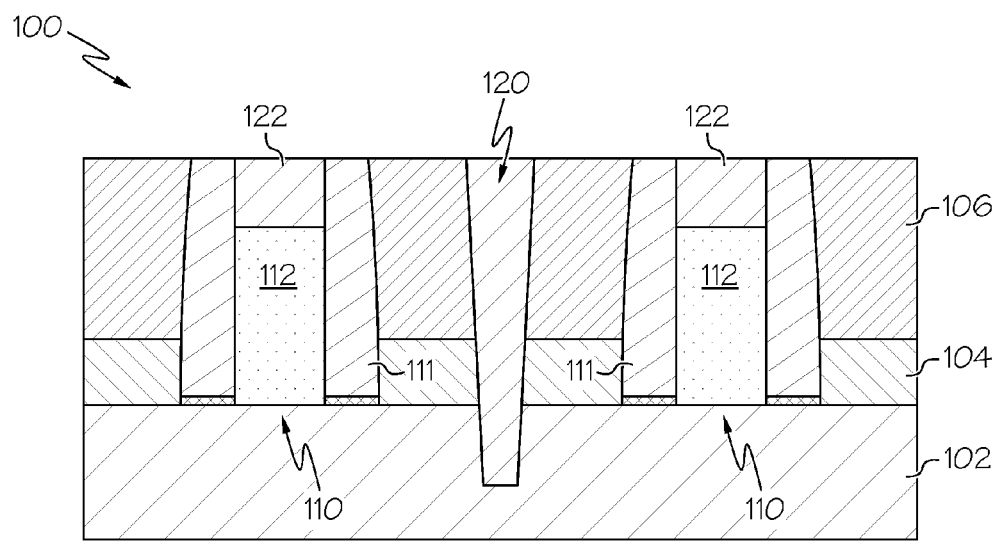
FIG. 7 shows a cross-sectional view of a processing step for forming the diffusion break in the semiconductor device according to illustrative embodiments.
Figure 8:
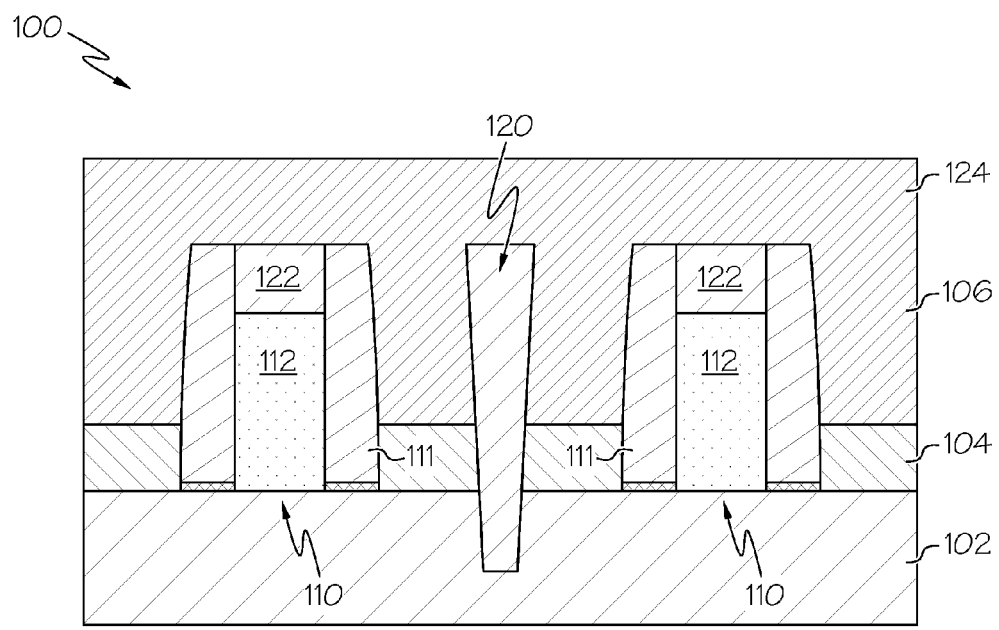
FIG. 8 shows a cross-sectional view of the semiconductor device including the diffusion break formed therein according to illustrative embodiments.

Opening 116 is then extended down through dielectric material 106, epi junction area 104, and into substrate 102, as shown in FIG. 5. Here, opening 116 is formed between RMG structures 110, and cuts perpendicularly through each fin extending from RMG structures 110. Next, as shown in FIG. 6, SiN is deposited over device 100 and within opening 116 to form a diffusion break 120. In this embodiment, SiN is deposited atop all of device 100, thereby also forming a SiN cap 122 over each RMG structure 110 following partial removal of the SiN atop device 100, as more clearly shown in FIG. 7. In this embodiment, the SiN may be removed via CMP. Finally, an interlayer dielectric (ILD) oxide 124 is formed over device 100, as shown in FIG. 8, and processing of device 100 continues as known in the art.

Figure 9:
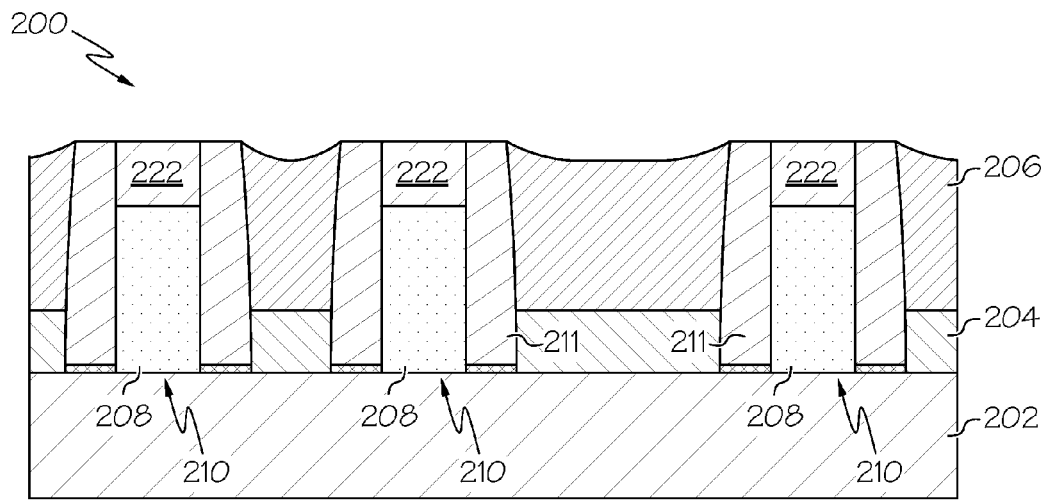
FIG. 9 shows a cross-sectional view of a processing step for forming the diffusion break in the semiconductor device according to illustrative embodiments.

Referring now to FIG. 9, a cross-sectional view of a device 200 is shown and described in greater detail. In this embodiment, device 200 comprises a substrate 202 and an epi junction area 204 over substrate 202, wherein epi junction area 204 is between each of RMG structures 210 (e.g., finFETs). Also shown is a dielectric material 206 formed over epi junction area 204. RMG structures 210 are formed over a set of fins (e.g., gate electrode 208) patterned from substrate 202. Substrate 202 may be silicon in a crystalline structure (e.g., a bulk silicon substrate). STI layer 206 may include any suitable insulating material.

RMG structures 210 may be fabricated using any suitable process including one or more photolithography and etch processes. The photolithography process may include forming a photoresist layer (not shown) overlying substrate 202 (e.g., on a silicon layer), exposing the resist to a pattern, performing post-exposure bake processes, and developing the resist to form a masking element including the resist. The masking element may then be used to etch RMG structures 210 into the silicon layer, e.g., using reactive ion etch (RIE) and/or other suitable processes.

In one embodiment, RMG structures 210 are formed by a double-patterning lithography (DPL) process. DPL is a method of constructing a pattern on a substrate by dividing the pattern into two interleaved patterns. DPL allows enhanced feature (e.g., fin) density. Various DPL methodologies may used including, double exposure (e.g., using two mask sets), forming spacers 211 adjacent features and removing the features to provide a pattern of spacers, resist freezing, and/or other suitable processes.

In this embodiment, each RMG structure 210 includes a gate electrode 208. Numerous other layers may also be present, for example, a gate dielectric layer, a capping layer 222, interface layers, and/or other suitable features. The gate dielectric layer may include dielectric material such as, silicon oxide, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, and/or combinations thereof. The gate dielectric layer may be formed using processes such as, photolithography patterning, oxidation, deposition, etching, and/or other suitable processes. Gate electrode 208 may include polysilicon, silicon-germanium, a metal including metal compounds such as, Mo, Cu, W, Ti, Ta, TiN, TaN, NiSi, CoSi, and/or other suitable conductive materials known in the art. Gate electrode 208 may be formed using processes such as, physical vapor deposition (PVD), CVD, plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes.

Figure 10:
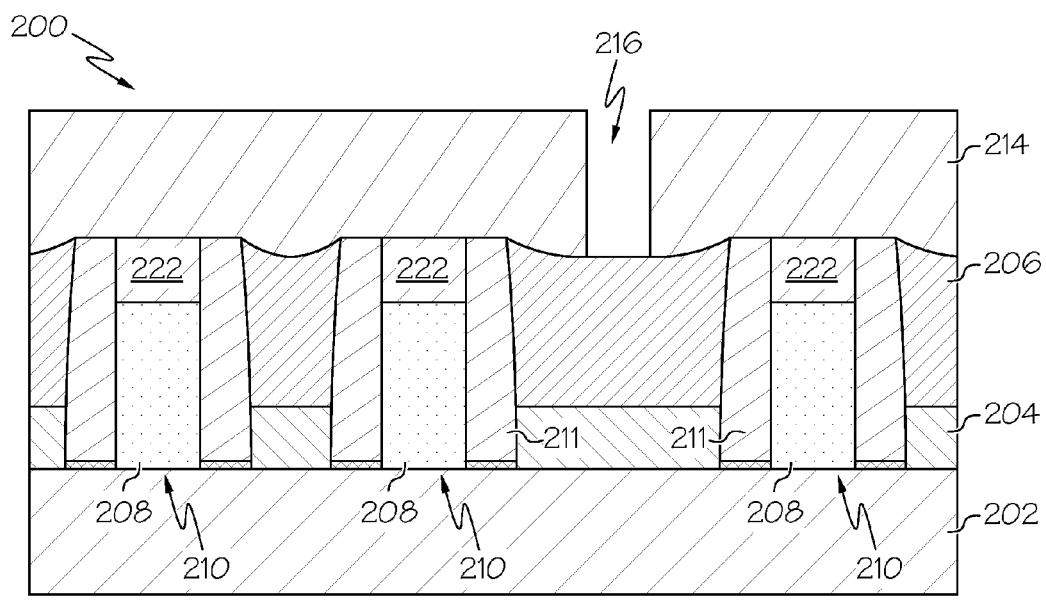
FIG. 10 shows a cross-sectional view of a processing step for forming the diffusion break in the semiconductor device according to illustrative embodiments.

Next, as shown in FIG. 10, a mask 214 is formed over device 200, and an opening 216 is formed therein. In one embodiment, opening 216 is patterned, for example, using a photo-lithography processes or other lithographic process (e.g., electron beam lithography, imprint lithography, etc.), and removed by a suitable etching process including a wet etch, dry etch, plasma etch, and the like. In one embodiment, hard mask 214 comprises SiN or SiO2.

Figure 11:
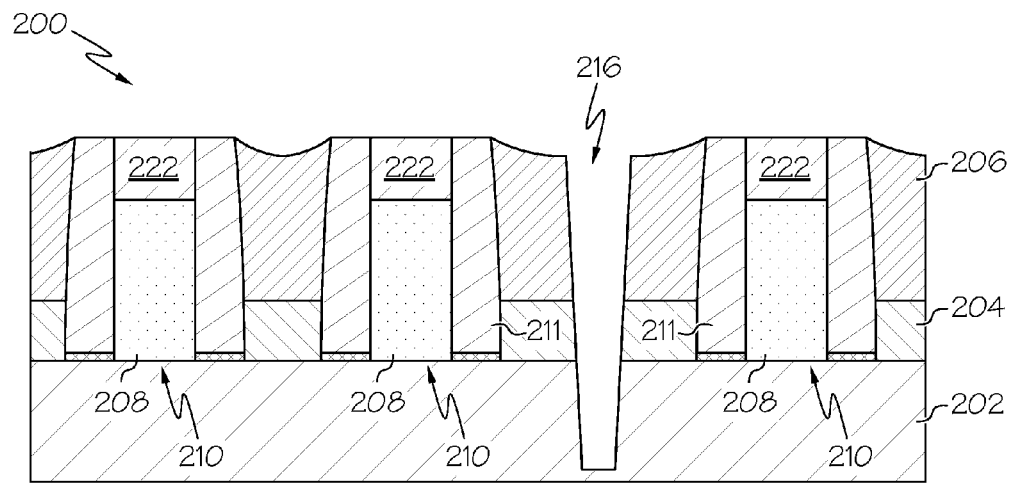
FIG. 11 shows a cross-sectional view of a processing step for forming the diffusion break in the semiconductor device according to illustrative embodiments.
Figure 12:
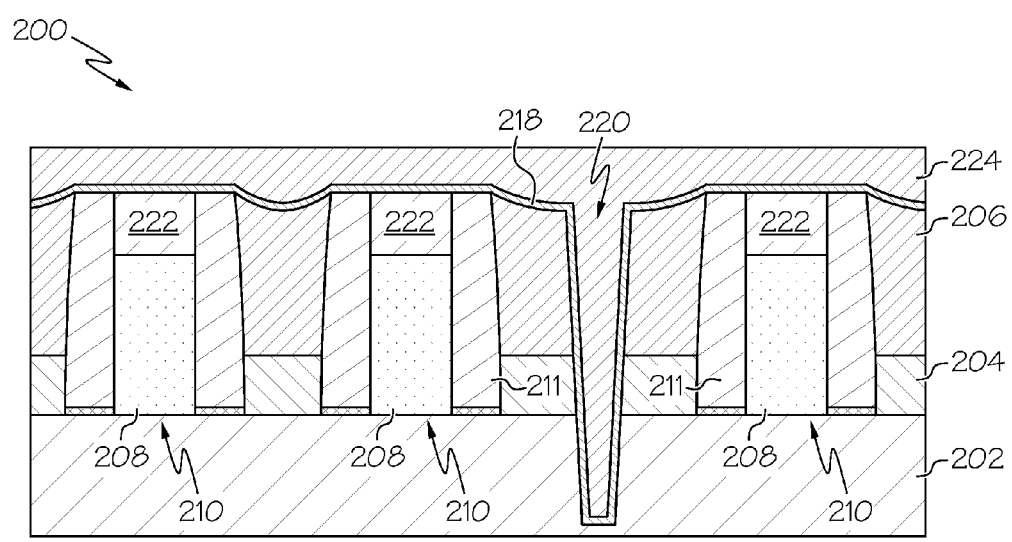
FIG. 12 shows a cross-sectional view of a processing step for forming the diffusion break in the semiconductor device according to illustrative embodiments.

Opening 216 is then extended down through dielectric material 206, epi layer 204, and into substrate 202, as shown in FIG. 11. Here, opening 216 is formed between RMG structures 210, and cuts perpendicularly through each fin extending from RMG structures 110. Next, as shown in FIG. 12, a SiN (or optionally high-k) liner 218 is deposited over device 200 and along a surface of opening 216. An oxide layer 224 is then formed over device 200, including over SiN liner 218 within opening 216, to form a diffusion break 220 in device 200. Oxide layer 224 is then removed over each RMG 210 selective to SiN liner 218 (not shown).

Figure 13:
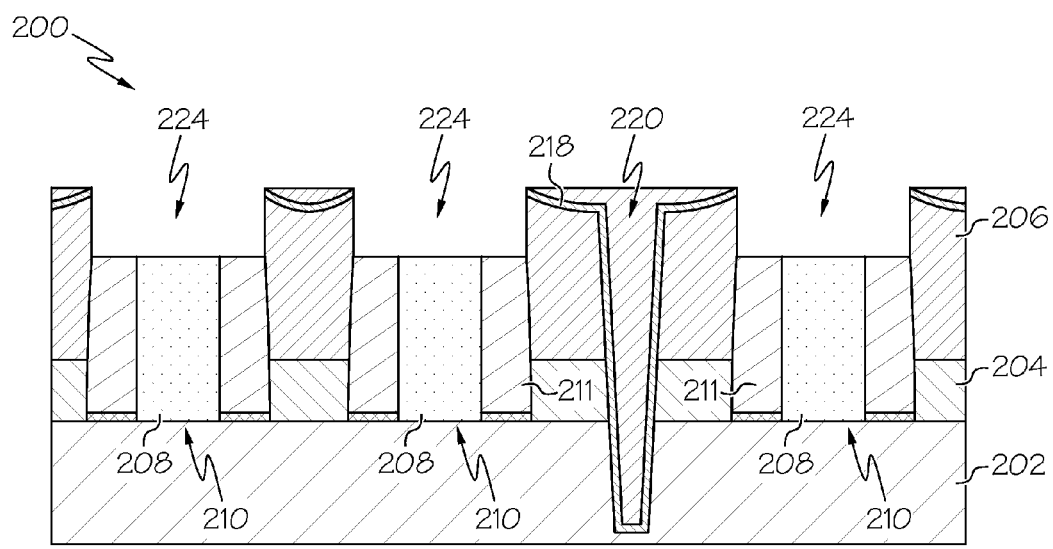
FIG. 13 shows a cross-sectional view of a processing step for forming the diffusion break in the semiconductor device according to illustrative embodiments.
Figure 14:
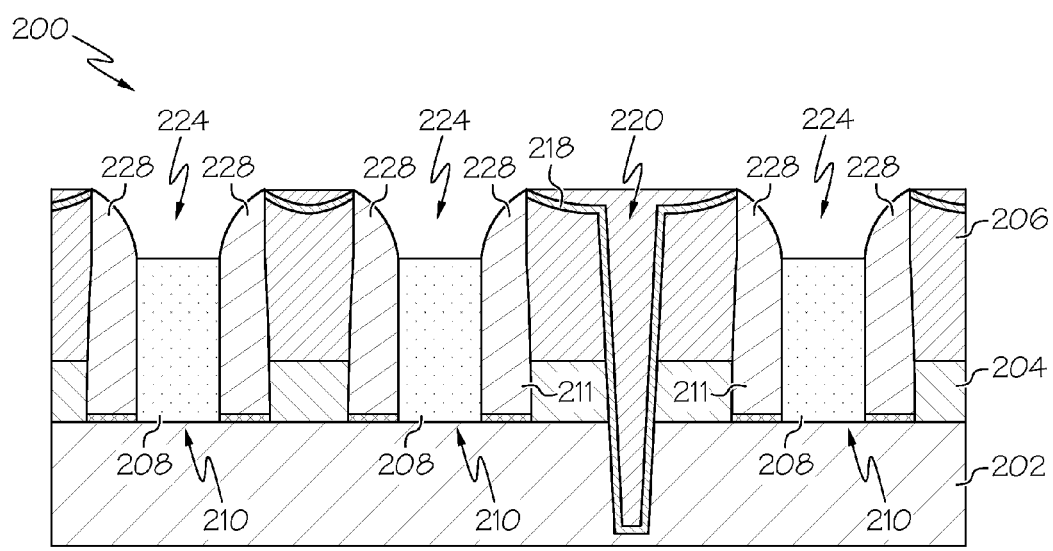
FIG. 14 shows a cross-sectional view of a processing step for forming the diffusion break in the semiconductor device according to illustrative embodiments.

Next, as shown in FIG. 13, a nitride hard mask recess is performed to remove capping layer 222 and SiN liner 218 over each RMG structure 210, and form an opening 224 therein. Nitride spacers 228 may then be formed within openings 224 to protect the ILD sidewall, as shown in FIG. 14.

Figure 15:
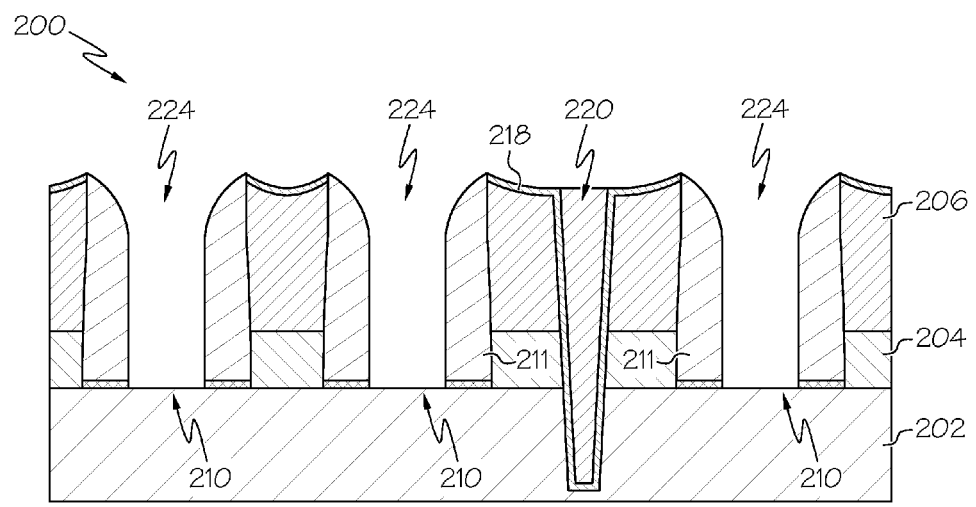
FIG. 15 shows a cross-sectional view of a processing step for forming the diffusion break in the semiconductor device according to illustrative embodiments.
Figure 16:
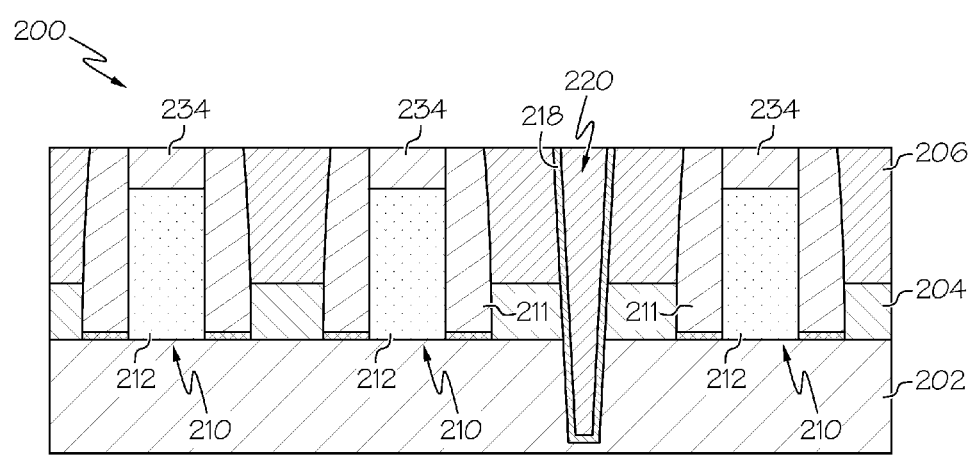
FIG. 16 shows a cross-sectional view of a processing step for forming the diffusion break in the semiconductor device according to illustrative embodiments.
Figure 17:
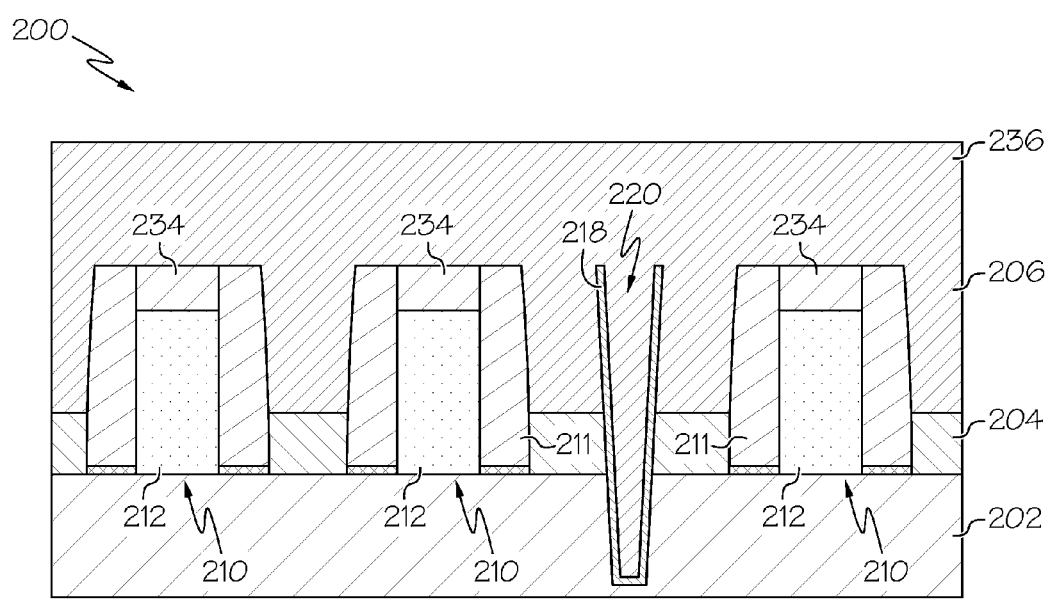
FIG. 17 shows a cross-sectional view of the semiconductor device including the diffusion break formed therein according to illustrative embodiments.

Next, as shown in FIG. 15, gate electrode 208 (e.g., polysilicon) is then removed from each RMG structure 210 selective to a top surface 230 of substrate 202. In this embodiment, gate electrode 208 is removed using a polysilicon pull back. Once removed, a metal material 212 (e.g., W) is formed within each RMG structure 210, as shown in FIG. 16, and another capping layer 234 (e.g., a self-aligned SiN contact cap) is formed atop metal material 212 to complete each RMG structure 210. Finally, another oxide layer 236 is formed over device 200, as shown in FIG. 17, and processing of device 200 continues as known in the art.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided device isolation in a complimentary metal-oxide fin field effect transistor. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
    providing a set of replacement metal gate (RMG) structures over a set of fins patterned from a substrate;
    providing a dielectric material over an epitaxial junction area;
    forming an opening between the set of RMG structures and through the set of fins, wherein the opening extends through the dielectric material, the expitaxial junction area, and into the substrate; and
    depositing silicon nitride (SiN) within the opening to form a diffusion break in the device.

2. The method according to claim 1, the depositing the SiN comprising forming a SiN liner along a surface of the opening.

3. The method according to claim 2, further comprising forming an oxide layer over the SiN liner.

4. The method according to claim 3, further comprising:
    patterning an opening over each of the set of RMG structures; and
    forming a spacer within the opening over each of the set of RMG structures.

5. The method according to claim 4, further comprising:
    removing a polysilicon material from each of the set of RMG structures selective to a top surface of the substrate;
    forming a metal material within each of the set of RMG structures;
    forming a SiN cap over the metal material within each of the set of RMG structures; and
    depositing an interlayer dielectric oxide over the device.

6. The method according to claim 1, further comprising:
    patterning an opening over each of the set of RMG structures; and
    depositing the SiN within the opening over each of the set of RMG structures.

7. The method according to claim 6, further comprising:
    removing a portion of the SiN over the device; and
    depositing an interlayer dielectric oxide over the device.

8. A method for forming a diffusion break in a semiconductor device, the method comprising:
    providing a set of replacement metal gate (RMG) structures over a set of fins patterned from a substrate;
    providing a dielectric material over an epitaxial junction area;
    forming an opening between the set of RMG structures and through the set of fins, wherein the opening extends through the dielectric material, the expitaxial junction area, and into the substrate; and
    depositing silicon nitride (SiN) within the opening to form the diffusion break in the semiconductor device.

9. The method according to claim 8, the depositing the SiN comprising forming a SiN liner along a surface of the opening.

10. The method according to claim 9, further comprising forming an oxide layer over the SiN liner.

11. The method according to claim 10, further comprising:
    patterning an opening over each of the set of RMG structures; and
    forming a spacer within the opening over each of the set of RMG structures.

12. The method according to claim 11, further comprising:
    removing a polysilicon material from each of the set of RMG structures selective to a top surface of the substrate;
    forming a metal material within each of the set of RMG structures;
    forming a SiN cap over the metal material within each of the set of RMG structures; and
    depositing an interlayer dielectric oxide over the device.

13. The method according to claim 8, further comprising:
    patterning an opening over each of the set of RMG structures; and
    depositing the SiN within the opening over each of the set of RMG structures.

14. The method according to claim 13, further comprising:
    removing a portion of the SiN over the device; and
    depositing an interlayer dielectric oxide over the device.

15. A device, comprising:
    a set of replacement metal gate (RMG) structures over a set of fins patterned from a substrate;
    a dielectric material over an epitaxial junction area;
    an opening formed between the set of RMG structures and through the set of fins, wherein the opening extends through the dielectric material, the expitaxial junction area, and into the substrate; and
    silicon nitride (SiN) deposited within the opening to form a diffusion break.

16. The device according to claim 15, the SiN comprising a SiN liner formed along a surface of the opening.

17. The device according to claim 16, further comprising an oxide layer formed over the SiN liner.

18. The device according to claim 17, further comprising:
    an opening patterned over each of the set of RMG structures; and
    a spacer formed within the opening over each of the set of RMG structures.

19. The device according to claim 18, further comprising:
    a SiN cap formed over the metal material within each of the set of RMG structures; and
    an interlayer dielectric oxide deposited over the device.

20. The device according to claim 15, further comprising:
    SiN formed within an opening over each of the set of RMG structures; and
    an interlayer dielectric oxide deposited over the device.

* * * * *